US012597895B2

(12) United States Patent
Lin et al.

(10) Patent No.: US 12,597,895 B2
(45) Date of Patent: Apr. 7, 2026

(54) LOW-NOISE AMPLIFIER WITH MOM Q ENHANCEMENT

(71) Applicant: Taiwan Semiconductor Manufacturing Company, Ltd., Hsinchu (TW)

(72) Inventors: Wu-Chen Lin, Hsinchu (TW); Yi-Hsuan Liu, Hualien (TW); Hsieh-Hung Hsieh, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/663,196

(22) Filed: May 14, 2024

(65) Prior Publication Data

US 2025/0357903 A1 Nov. 20, 2025

(51) Int. Cl.
*H03F 3/24* (2006.01)
*H03F 1/56* (2006.01)

(52) U.S. Cl.
CPC ............. *H03F 3/245* (2013.01); *H03F 1/565* (2013.01); *H03F 2200/294* (2013.01); *H03F 2200/451* (2013.01)

(58) Field of Classification Search
CPC .... H03F 3/245; H03F 1/565; H03F 2200/294; H03F 2200/451

USPC .......................................................... 375/297
See application file for complete search history.

(56) References Cited

U.S. PATENT DOCUMENTS

| | | | |
|---|---|---|---|
| 11,159,191 B1 * | 10/2021 | Mohammadnezhad | ..................... H03G 3/3052 |
| 2007/0187721 A1 | 8/2007 | Ahn et al. | |
| 2010/0123214 A1 | 5/2010 | Chen et al. | |
| 2011/0043285 A1 | 2/2011 | Zhao et al. | |
| 2018/0069510 A1 | 3/2018 | Granger-Jones et al. | |

OTHER PUBLICATIONS

Hsueh et al., "Analog/RF Wonderland: Circuit and Technology Co-optimization in Advanced FinFET Technology," IEEE Symposium on VLSI Technology Digest of Technical Papers, 2 pages (2016).

* cited by examiner

*Primary Examiner* — Dominic D Saltarelli
(74) *Attorney, Agent, or Firm* — Merchant & Gould P.C.

(57) ABSTRACT

An electronic device includes an amplifier having an input terminal and an output terminal. The amplifier includes a gain stage and an output impedance matching network connected to the gain stage and to the output terminal. The output impedance matching network includes a plurality of metal-oxide-metal (MOM) capacitors connected in parallel to each other.

20 Claims, 13 Drawing Sheets

| N6 2.4GHz LNA | Original | With MOM Q Enhancement |
|---|---|---|
| $V_{DD}$ (V) | 0.75 | 0.75 |
| $P_{dc}$ (mW) | 3.2 | 3.2 |
| Gain (dB) | 16.96 (x1) | 18.51 (x1.43) |
| NF (dB) | 1.65 (x1) | 1.58 (x0.98) |

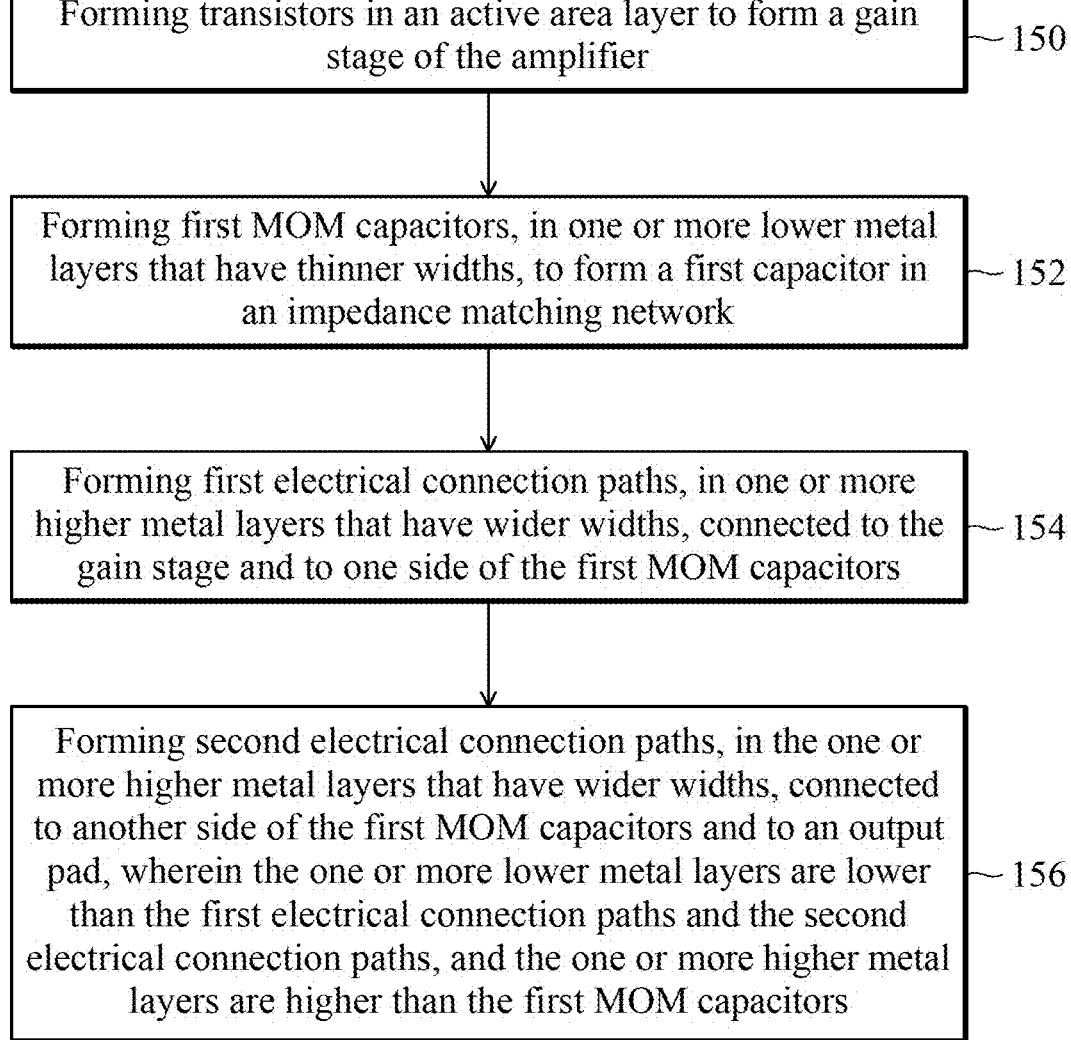

Forming transistors in an active area layer to form a gain stage of the amplifier ~150

Forming first MOM capacitors, in one or more lower metal layers that have thinner widths, to form a first capacitor in an impedance matching network ~152

Forming first electrical connection paths, in one or more higher metal layers that have wider widths, connected to the gain stage and to one side of the first MOM capacitors ~154

Forming second electrical connection paths, in the one or more higher metal layers that have wider widths, connected to another side of the first MOM capacitors and to an output pad, wherein the one or more lower metal layers are lower than the first electrical connection paths and the second electrical connection paths, and the one or more higher metal layers are higher than the first MOM capacitors ~156

LOW-NOISE AMPLIFIER WITH MOM Q ENHANCEMENT

BACKGROUND

Typically, amplifiers increase the power and noise of an input signal and introduce additional noise into an output signal. Low-noise amplifiers (LNAs) are circuits that amplify the input signals, such as very low-power input signals, without degrading the signal-to-noise ratio (SNR) of the input/output signal. LNAs are designed to minimize additional noise by choosing special components, operating points, and circuit topologies, where minimizing additional noise is balanced with other design considerations, such as power gain and impedance matching.

LNAs can be found in radio frequency (RF) communication systems, medical instruments, and electronic test equipment. Although LNAs are primarily concerned with weak signals that are just above the noise floor, LNAs must also consider the presence of larger signals. Also, wafer costs are high for advanced complementary metal-oxide semiconductor (CMOS) technologies, such that improvements in power, performance, and area (PPA) justify the costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the disclosure and are not intended to be limiting.

2

Figure 9:
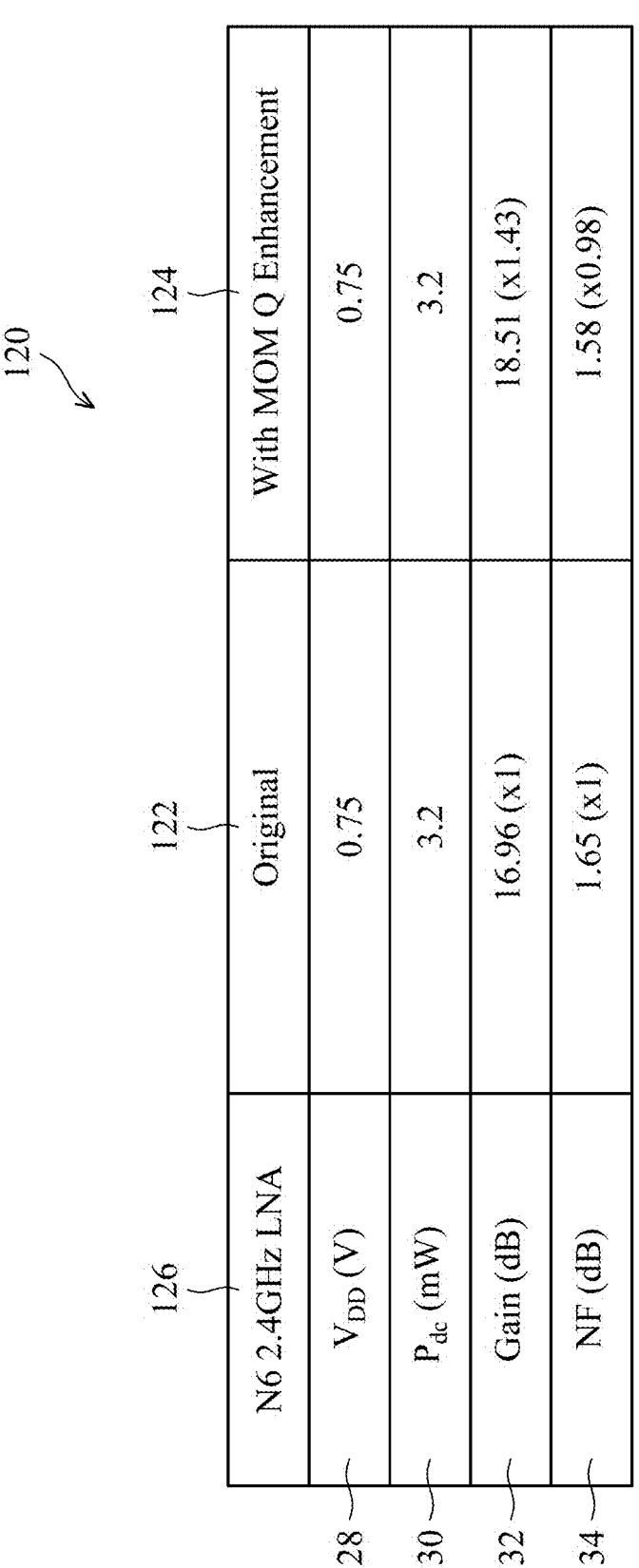

FIG. 9 is a diagram schematically illustrating experimental results for an LNA that includes each of the second capacitor $C_2$ and the third capacitor $C_3$ made with original large MOM capacitors and with smaller MOM capacitors connected in parallel that provide MOM Q enhancement, in accordance with some embodiments.

Figure 10:
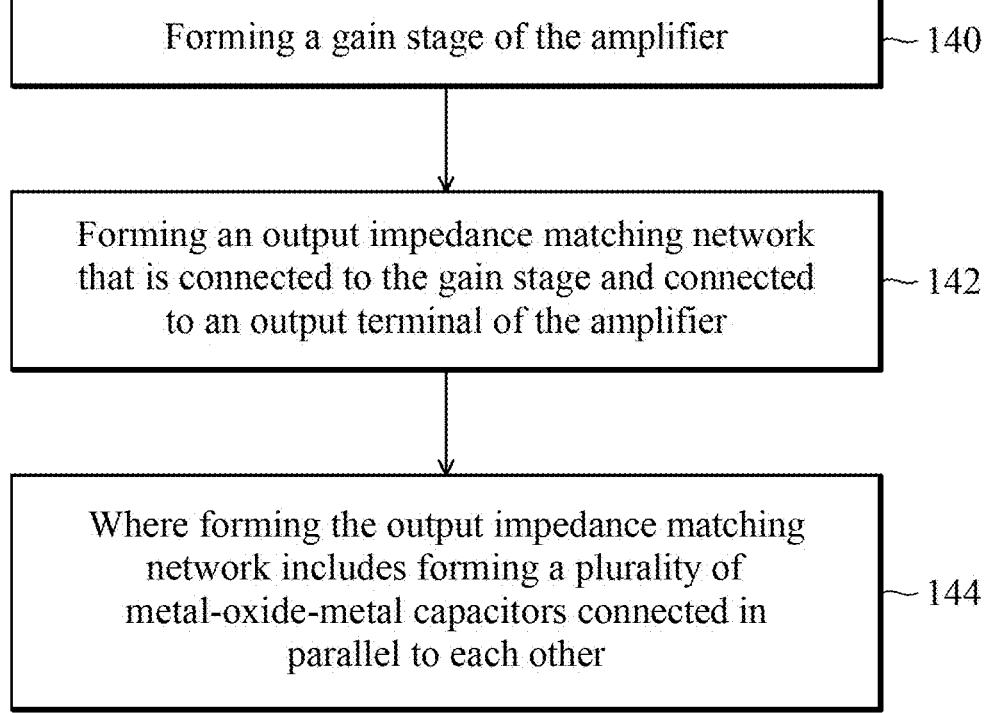

FIG. 10 is a flow chart diagram schematically illustrating a method of manufacturing an amplifier, in accordance with some embodiments.

FIG. 11 is a flow chart diagram schematically illustrating another method of manufacturing an amplifier, in accordance with some embodiments.

Figure 12:
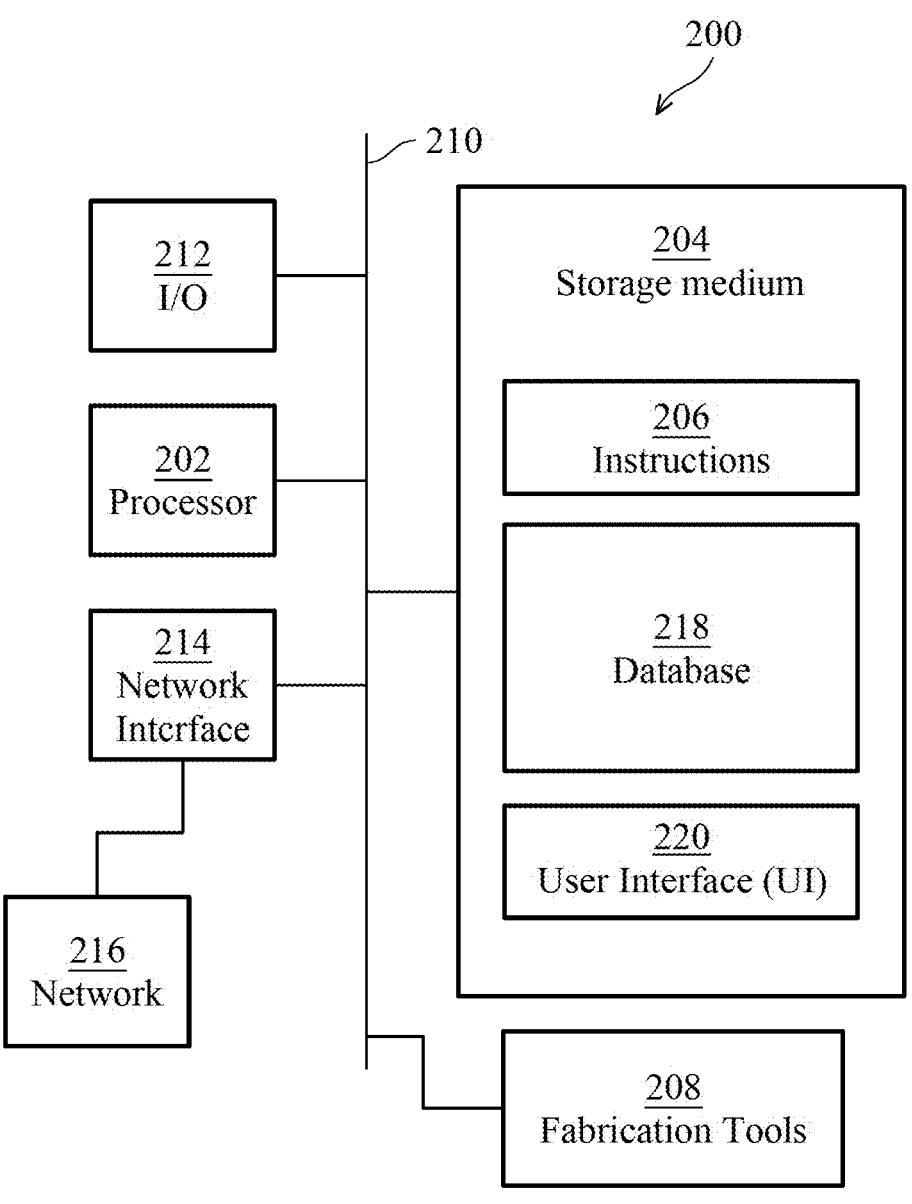

FIG. 12 is a block diagram schematically illustrating an example of a computer system configured to provide the electronic devices, semiconductor devices, and methods of the current disclosure, in accordance with some embodiments.

Figure 13:
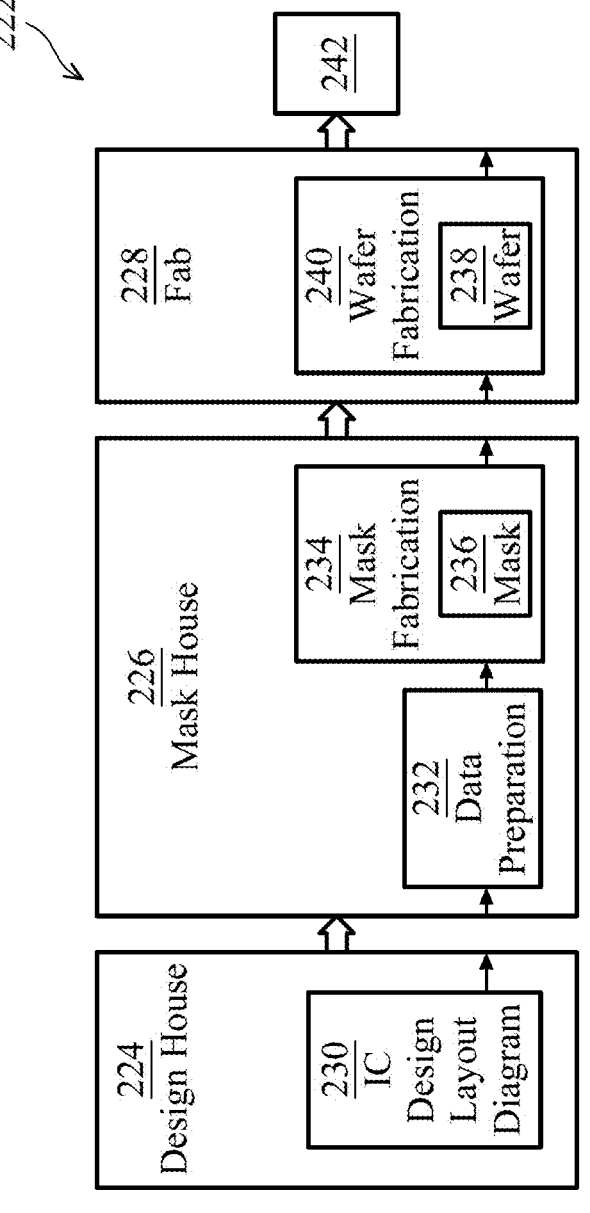

FIG. 13 is a block diagram of a semiconductor device manufacturing system and a semiconductor device manufacturing flow associated therewith, in accordance with some embodiments.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some LNAs include metal-oxide-metal (MOM) capacitors for impedance matching, alternating current (AC) coupling, and/or bypass capacitors. Impedance matching networks can include inductors and MOM capacitors, such as conductive finger metal-oxide-metal (CFMOM) capacitors and rotative metal-oxide-metal (CRTMOM) capacitors. The MOM capacitors are realized in lower metal layers of the semiconductor device and with scaling at advanced CMOS technology nodes the thickness of the lower metal layers is reduced due to lithography limitations. This reduced thickness of the lower metal layers results in reduced Q factors of the MOM capacitors in the advanced CMOS nodes, such that the gain and noise factors of the LNAs are impacted.

Also, some LNAs operate at multi-giga hertz (GHz) frequencies where large capacitors, such as 1 pico-farad (pF)

capacitors at 2.4 GHz, are utilized. To provide these large capacitors, MOM capacitors are formed with longer metal lengths, which results in larger parasitic resistances and reduced Q factors in the MOM capacitors, especially in the advanced CMOS nodes, such as the 6 nanometer (nm) node. With the Q factors of the MOM capacitors reduced, the gain and noise factors of the LNAs are further impacted.

Disclosed embodiments provide LNAs including MOM capacitors with enhanced Q factors, such that the gain and noise of the LNAs are improved. In some embodiments, at least one larger capacitor is formed with multiple smaller MOM capacitors connected in parallel to each other to realize the capacitance value of the at least one larger capacitor. This reduces the parasitic resistance of the capacitor and increases the Q factor of the at least one capacitor. This is especially helpful in advanced CMOS nodes and results in enhanced Q factors and better gain and noise factors in the LNAs.

Disclosed embodiments further include a routing re-use technique, where the multiple smaller MOM capacitors connected in parallel to each other are situated underneath a signal path, such as a signal path from the gain stage of an LNA to the output terminal of the LNA. This mitigates power loss in the signal path connection line and results in boosting the LNA performance in terms of gain and noise factors.

Advantages of these MOM Q enhancement techniques in LNAs, such as RF LNAs, include gain and noise enhancements in advanced nodes, such as the 6 nm CMOS node, resulting in better LNA performance and justifying the increased cost.

Figure 1:
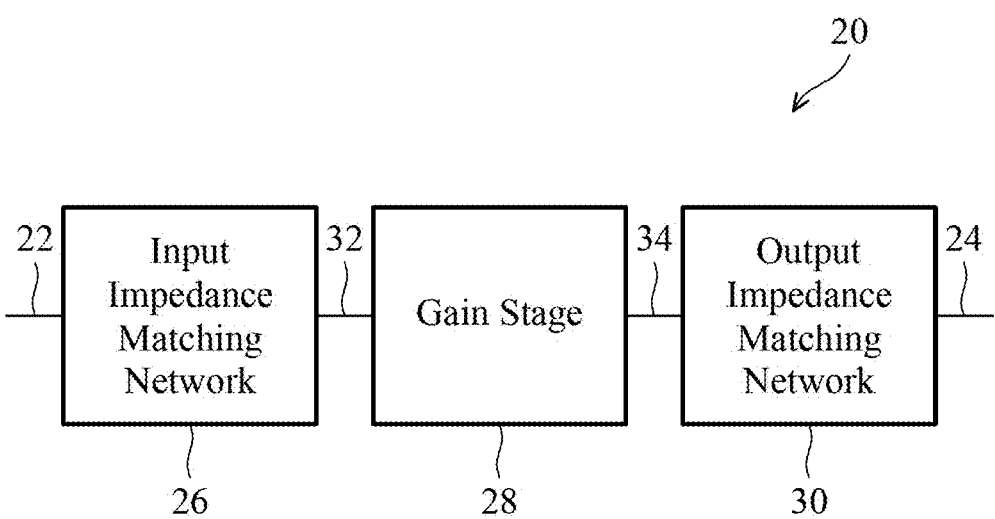
FIG. 1 is a block diagram schematically illustrating an LNA device, in accordance with some embodiments.

FIG. 1 is a diagram schematically illustrating an LNA device 20, in accordance with some embodiments. The LNA 20 has an input terminal 22 and an output terminal 24 and includes an input impedance matching network 26, a gain stage 28, and an output impedance matching network 30. The input terminal 22 is electrically connected to the input impedance matching network 26 that is electrically connected to the gain stage 28 by a communications path 32. The gain stage 28 is electrically connected to the output impedance matching network 30 by a communications path 34, and the output terminal 24 is electrically connected to the output impedance matching network 30.

The input terminal 22 receives an input signal, such as an RF input signal, and passes the input signal to the input impedance matching network 26 that is impedance matched to the signal channel carrying the input signal. The gain stage 28 amplifies the received input signal and provides an amplified signal to the output impedance matching network 30 that provides an amplified output signal, such as an amplified RF output signal, to the output terminal 24. The output impedance matching network 30 is impedance matched to the signal channel that carries the amplified output signal.

In some embodiments, the output impedance matching network 30 includes at least one capacitor that includes a plurality of MOM capacitors connected in parallel to each other to provide a larger capacitance in the output impedance matching network 30. In some embodiments, the output impedance matching network 30 includes a capacitor that includes a plurality of MOM capacitors connected in parallel to each other to provide a larger capacitance value of the capacitor, where each of the plurality of the smaller MOM capacitors has a shorter metal length and a reduced parasitic resistance, which enhances the Q factor of the larger capacitor.

In some embodiments, the output impedance matching network 30 includes a capacitor that includes multiple MOM capacitors connected in parallel to each other and having a first end connected to the gain stage 28 and a second end connected to the output terminal 24. In some embodiments, the output impedance matching network 30 includes a capacitor that includes multiple MOM capacitors connected in parallel to each other and having a first end connected to the output terminal 24 and a second end connected to a reference, such as ground. In some embodiments, the output impedance matching network 30 includes a capacitor that includes multiple MOM capacitors connected in parallel to each other and situated under or at least partially under one or more signal paths situated between the gain stage 28 and the output terminal 24. In some embodiments, the output impedance matching network 30 includes a capacitor that includes multiple MOM capacitors connected in parallel to each other and having a first end connected to the gain stage 28 and a second end connected to the output terminal 24 and being situated under or at least partially under one or more signal paths situated between the gain stage 28 and the output terminal 24.

Figure 2:
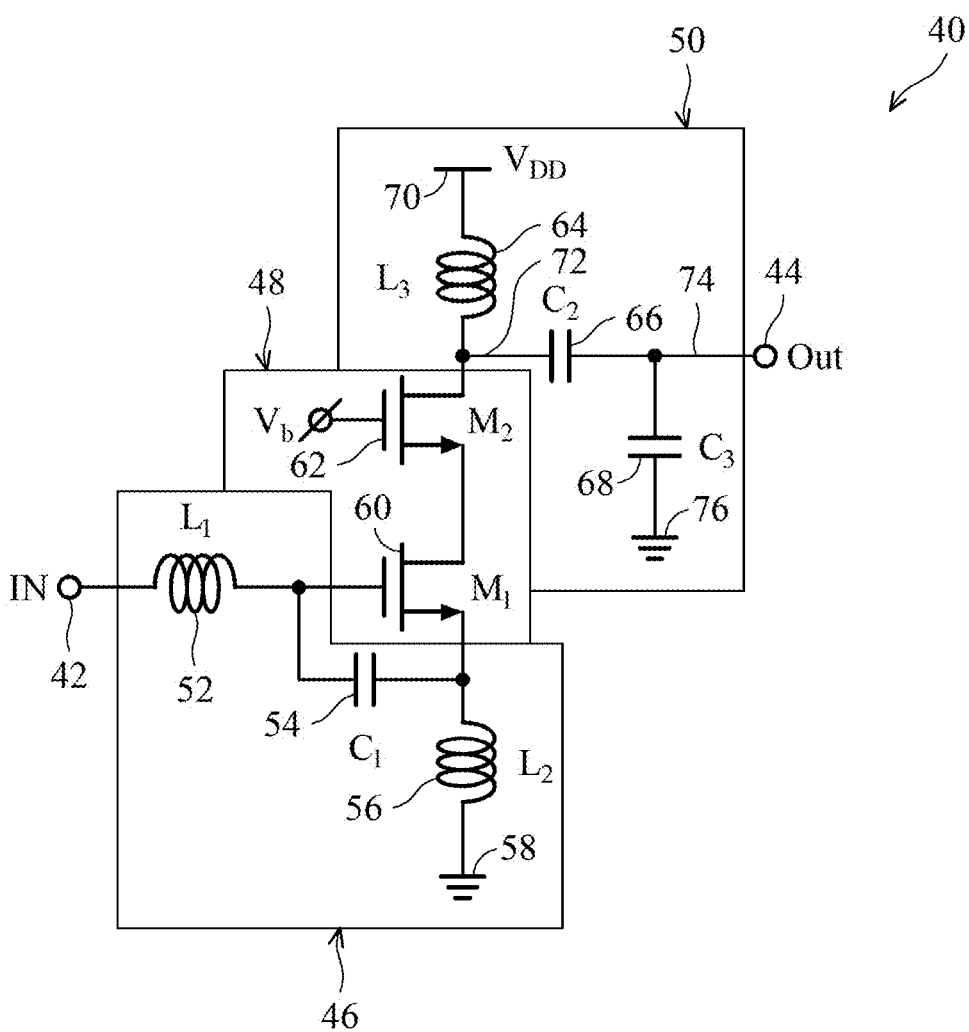
FIG. 2 is a circuit diagram schematically illustrating an LNA device, in accordance with some embodiments.

FIG. 2 is a diagram schematically illustrating an LNA device 40, in accordance with some embodiments. The LNA 40 includes an input terminal IN 42, an output terminal OUT 44, an input impedance matching network 46, a gain stage 48, and an output impedance matching network 50. The LNA 40 is one example of the LNA 20 of FIG. 1. The input terminal IN 42 is like the input terminal 22 and the output terminal OUT 44 is like the output terminal 24. Also, the input impedance matching network 46 is like the input impedance matching network 26, the gain stage 48 is like the gain stage 28, and the output impedance matching network 50 is like the output impedance matching network 30.

The input terminal IN 42 is electrically connected to the input impedance matching network 46 that is electrically connected to the gain stage 48 that is electrically connected to the output impedance matching network 50. The output terminal OUT 44 is electrically connected to the output impedance matching network 50.

The input terminal IN 42 receives an input signal, such as an RF input signal, and passes the input signal to the input impedance matching network 46 that is impedance matched to the signal channel carrying the input signal. The input impedance matching network 46 provides a matching network signal to the gain stage 48.

The input impedance matching network 46 includes a first inductor $L_1$ 52, a first capacitor $C_1$ 54, and a second inductor $L_2$ 56 that is also referred to as a source degeneration circuit. The input terminal IN 42 is electrically connected to one end of the first inductor $L_1$ 52 and the other end of the first inductor $L_1$ 52 is electrically connected to one end of the first capacitor $C_1$ 54 and to the gain stage 48. The other end of the first capacitor $C_1$ 54 is electrically connected to one end of the second inductor $L_2$ 56 and to the gain stage 48. The other end of the second inductor $L_2$ 56 is electrically connected to a reference 58, such as ground.

The gain stage 48 receives and amplifies the matching network signal and provides the amplified signal to the output impedance matching network 50. The gain stage 48 includes at least two metal-oxide semiconductor field-effect transistors (MOSFETs) having drain/source paths connected in series. The gain stage 48 includes a first MOSFET $M_1$ 60 and a second MOSFET $M_2$ 62. The second MOSFET $M_2$ 62 includes one drain/source terminal electrically connected to the output impedance matching network 50 and the other drain/source terminal electrically connected to one drain/ source terminal of the first MOSFET $M_1$ 60. The other drain/source terminal of the first MOSFET $M_1$ 60 is electrically connected to the other end of the first capacitor $C_1$ 54 and the one end of the second inductor $L_2$ 56. The gate of the first MOSFET $M_1$ 60 is electrically connected to the other end of the first inductor $L_1$ 52 and the one end of the first capacitor $C_1$ 54. The gate of the second MOSFET $M_2$ 62 is electrically connected to a bias voltage $V_b$.

The output impedance matching network 50 receives the amplified signal from the gain stage 48 and provides an amplified output signal, such as an amplified RF output signal, to the output terminal 44. The output impedance matching network 50 is impedance matched to the signal channel that carries the amplified output signal.

The output impedance matching network 50 includes a third inductor $L_3$ 64, a second capacitor $C_2$ 66, and a third capacitor $C_3$ 68. One end of the third inductor $L_3$ 64 is electrically connected to a power source terminal Vdd 70 and the other end of the third inductor $L_3$ 64 is electrically connected to the one drain/source terminal of the second MOSFET $M_2$ 62 and to one end of the second capacitor $C_2$ 66 by gain stage output path 72. The other end of the second capacitor $C_2$ 66 is electrically connected to one end of the third capacitor $C_3$ 68 and to the output terminal 44 by output path 74. The other end of the third capacitor $C_3$ 68 is electrically connected to a reference 76, such as ground. The output terminal 44 is configured to provide the amplified output signal.

In some embodiments, the second capacitor $C_2$ 66 includes a plurality of MOM capacitors connected in parallel to each other to provide a larger capacitance for the second capacitor $C_2$ 66 in the output impedance matching network 50. In some embodiments, the third capacitor $C_3$ 68 includes a plurality of MOM capacitors connected in parallel to each other to provide a larger capacitance for the third capacitor $C_3$ 68 in the output impedance matching network 50. In some embodiments, at least one of the second capacitor $C_2$ 66 and the third capacitor $C_3$ 68 includes multiple MOM capacitors connected in parallel to each other and situated, at least partially, underneath one or more signal paths between the gain stage 48 and the output terminal 44.

Figure 3:
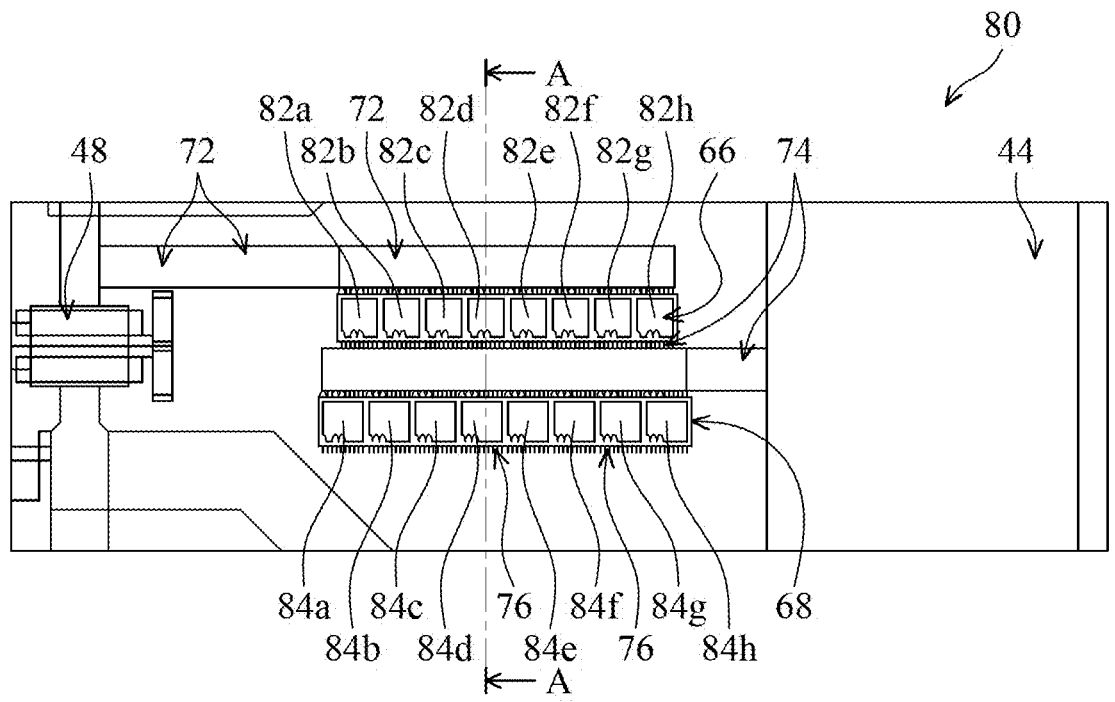
FIG. 3 is a diagram schematically illustrating a semiconductor device that includes the second capacitor $C_2$ connected to the gain stage by the gain stage output path, and the third capacitor $C_3$ connected to the second capacitor $C_2$ and to the output terminal by the output path, in accordance with some embodiments.

FIG. 3 is a diagram schematically illustrating a semiconductor device 80 that includes the second capacitor $C_2$ 66 connected to the gain stage 48 by the gain stage output path 72, and the third capacitor $C_3$ 68 connected to the second capacitor $C_2$ 66 and to the output terminal 44 by the output path 74, in accordance with some embodiments. In addition, the third capacitor $C_3$ 68 is connected to the reference 76. The semiconductor device 80 includes smaller MOM capacitors connected to each other in parallel to provide larger capacitance values for each of the second capacitor $C_2$ 66 and the third capacitor $C_3$ 68.

The second capacitor $C_2$ 66 includes eight MOM capacitors 82a-82h connected in parallel to each other. Each of the eight MOM capacitors 82a-82h can be any suitable shape, such as a square, a rectangular, or finger shaped. The resulting second capacitor $C_2$ 66 has a capacitance value that is equal to adding together the eight MOM capacitor values. This avoids having one large MOM capacitor with one long metal length and, in comparison to one large MOM capacitor, each of the eight smaller MOM capacitors has a shorter metal length and a reduced parasitic resistance, which enhances the Q factor of the second capacitor $C_2$ 66.

Also, the third capacitor $C_3$ 68 includes eight MOM capacitors 84a-84h connected in parallel to each other. Each of the eight MOM capacitors 84a-84h can be any suitable shape, such as a square, a rectangular, or finger shaped. The resulting third capacitor $C_3$ 68 has a capacitance value that is equal to adding together the eight MOM capacitor values. This avoids having one large MOM capacitor with one long metal length and, in comparison to one large MOM capacitor, each of the eight smaller MOM capacitors has a shorter metal length and a reduced parasitic resistance, which enhances the Q factor of the third capacitor $C_3$ 68.

The gain stage output path 72 includes multiple metal lines connected from the gain stage 48 to one end of each of the eight MOM capacitors 82a-82h of the second capacitor $C_2$ 66. The output path 74 includes multiple metal lines connected to the other end of each of the eight MOM capacitors 82a-82h of the second capacitor $C_2$ 66 and to one end of each of the eight MOM capacitors 84a-84h of the third capacitor $C_3$ 68 and to the output terminal 44. In addition, the other end of each of the eight MOM capacitors 84a-84h of the third capacitor $C_3$ 68 is connected to the reference 76.

In some embodiments, the semiconductor device 80 includes multiple metal layers, such as metal layers 0-9. In some embodiments, each of the eight MOM capacitors 82a-82h of the second capacitor $C_2$ 66 is made from one or more of the metal layers 1-7. In some embodiments, each of the eight MOM capacitors 84a-84h of the third capacitor $C_3$ 68 is made from one or more of the metal layers 1-7. In some embodiments, each of the multiple metal lines in the gain stage output path 72 is made from one or more of the metal layers 8 and 9. In some embodiments, each of the multiple metal lines in the output path 74 is made from one or more of the metal layers 8 and 9. In some embodiments, each of the connections to the reference 76 is made from one or more of the metal layers 8 and 9.

Figure 4:
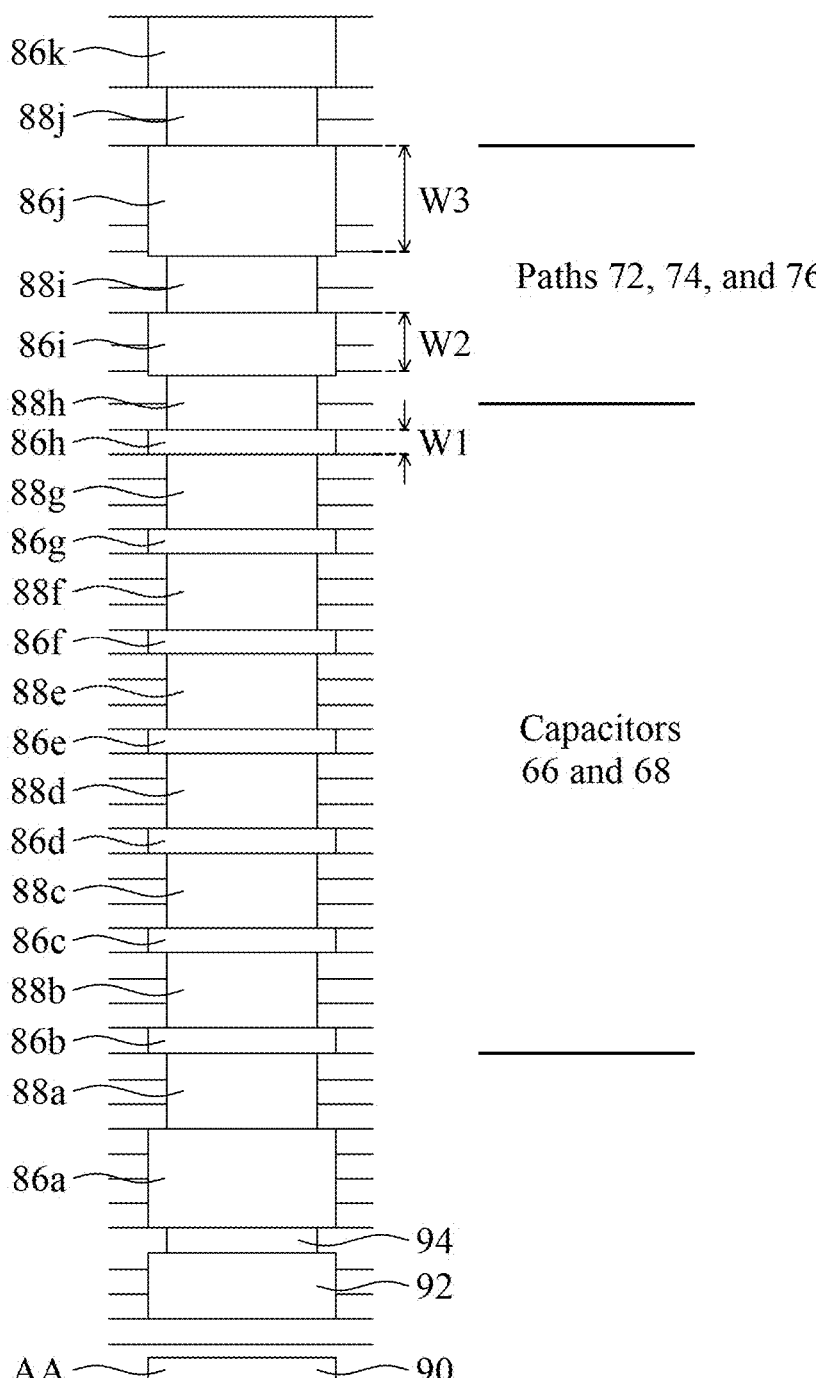
FIG. 4 is a diagram schematically illustrating metal layers, vias, an active area layer, a polysilicon layer, and a via that extends from the polysilicon layer to the metal layer 0 in the semiconductor device, in accordance with some embodiments.

FIG. 4 is a diagram schematically illustrating metal layers 86a-86k, vias 88a-88j, an active area layer 90, a polysilicon layer 92, and a via 94 that extends from the polysilicon layer 92 to the metal layer 0 86a in the semiconductor device 80, in accordance with some embodiments. The semiconductor device 80 includes components, such as transistors, in the active area layer 90. A polysilicon layer 92 is situated above the active area layer 90, and a via 94 extends from the polysilicon layer 92 to the metal layer 0 86a. Metal layers 86a-86k are connected by vias 88a-88j.

Each of the metal layers 1-7 86b-86h has a width W1 that is thinner than a width W2 of metal layer 8, which is thinner than a width W3 of metal layer 9. Each of the eight MOM capacitors 82a-82h of the second capacitor $C_2$ 66 is made from one or more of the metal layers 1-7 86b-86h. Also, each of the eight MOM capacitors 84a-84h of the third capacitor $C_3$ 68 is made from one or more of the metal layers 1-7 86b-86h. In addition, each of the multiple metal lines in the gain stage output path 72, each of the multiple metal lines in the output path 74, and each of the connection paths to the reference 76 are made from one or more of the metal layers 8 and 9 86i and 86j.

Figure 5:
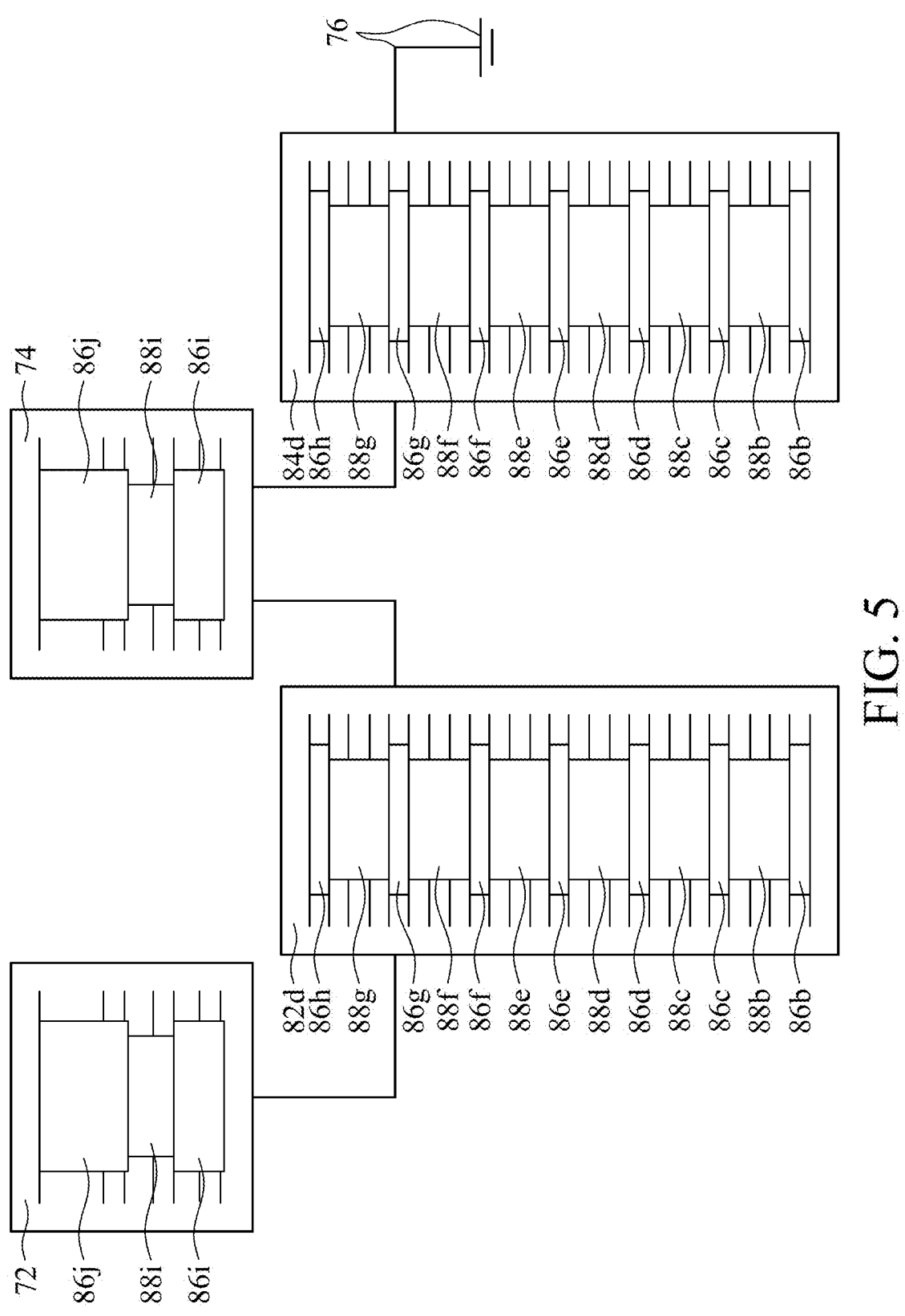
FIG. 5 is a diagram schematically illustrating a cross-section of the semiconductor device taken along the line A-A in FIG. 3, in accordance with some embodiments.

FIG. 5 is a diagram schematically illustrating a cross-section of the semiconductor device 80 taken along the line A-A in FIG. 3, in accordance with some embodiments. The multiple metal lines in the gain stage output path 72, the multiple metal lines in the output path 74, and the connection paths to the reference 76 are made from one or more of the metal layers 8 and 9 86i and 86j. Also, the MOM capacitor 82d of the second capacitor $C_2$ 66 is made from one or more of the metal layers 1-7 86b-86h, and the MOM capacitor 84d of the third capacitor $C_3$ 68 is made from one or more of the metal layers 1-7 86b-86h.

Figure 6:
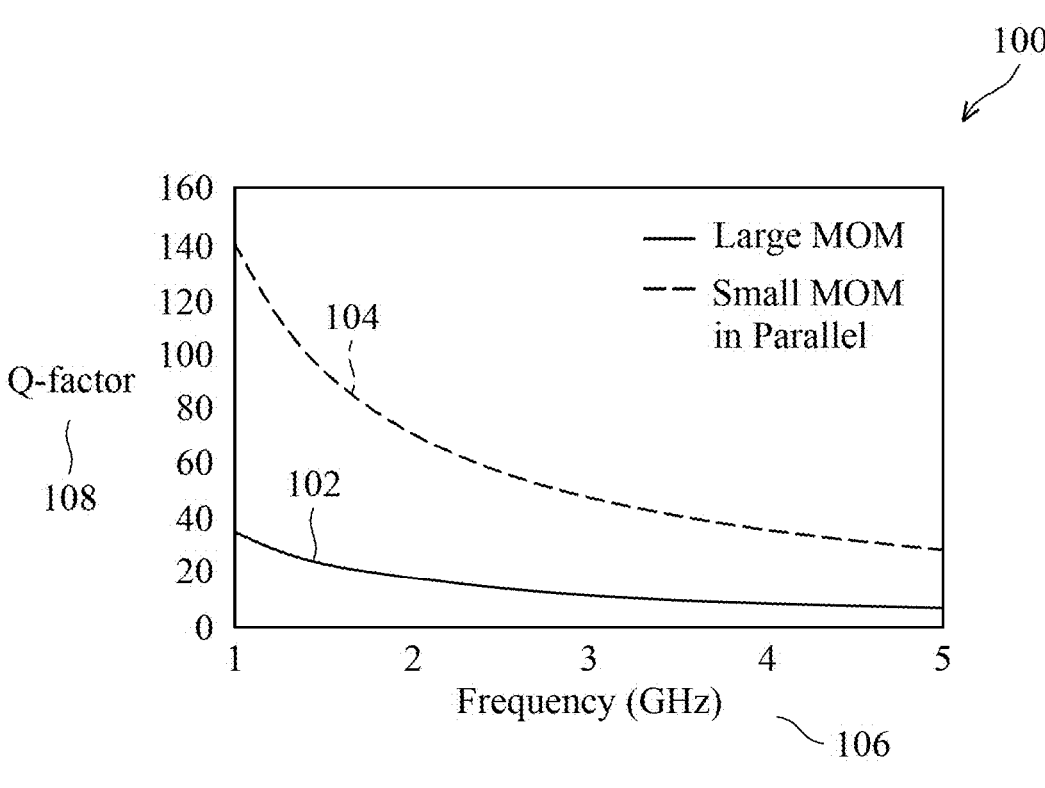
FIG. 6 is a diagram schematically illustrating a graph of Q-factor versus frequency for a first capacitor made with one large MOM capacitor and for a second capacitor made with multiple smaller MOM capacitors connected in parallel, in accordance with some embodiments.

FIG. 6 is a diagram schematically illustrating a graph 100 of Q-factor versus frequency for a first capacitor 102 made with one large MOM capacitor and for a second capacitor 104 made with multiple smaller MOM capacitors connected in parallel, in accordance with some embodiments. The frequency in GHz is graphed along the x-axis 106 and the Q-factor is graphed along the y-axis 108.

The second capacitor 104 has a higher Q-factor than the first capacitor 102 over the frequency range of 1 to 5 GHz. The first capacitor 102 has a Q-factor that ranges from about 35 to less than 10 over the frequency range of 1 to 5 GHz, while the second capacitor 104 has a Q-factor that ranges from about 140 to 30 over the frequency range of from 1 to 5 GHz.

Figure 7:
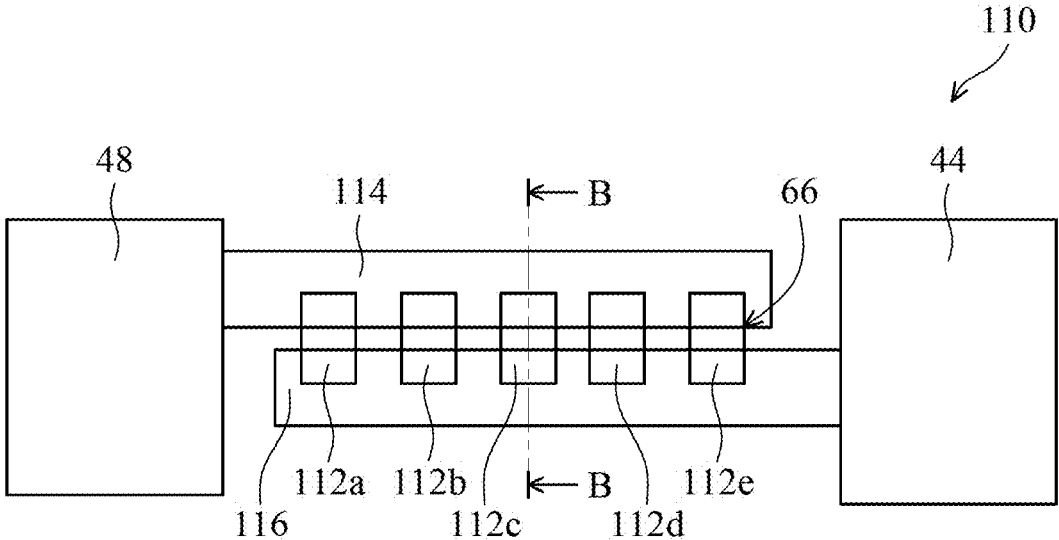
FIG. 7 is a diagram schematically illustrating a routing re-use technique in a semiconductor device for the second capacitor $C_2$ that is made from multiple MOM capacitors connected in parallel to each other, in accordance with some embodiments.

FIG. 7 is a diagram schematically illustrating a routing re-use technique in a semiconductor device 110 for the second capacitor $C_2$ 66 that is made from multiple MOM capacitors 112a-112e connected in parallel to each other, in accordance with some embodiments. The MOM capacitors 112a-112e that are connected in parallel provide an enhanced Q factor. With the smaller dimensions of the smaller MOM capacitors 112a-112e, the second capacitor $C_2$ 66 is placed or situated at least partially underneath the gain stage output path 114 from the gain stage 48 to one side of each of the multiple MOM capacitors 112a-112e, and the second capacitor $C_2$ 66 is placed or situated at least partially underneath the output path 116 from the other side of each of the multiple MOM capacitors 112a-112e to the output terminal 44. This avoids extra losses along the connection lines of the MOM capacitors 112a-112e and along the output paths 114 and 116 from the gain stage 48 to the output terminal 44. Also, each of the gain stage output path 114 and the output path 116 is made from multiple metal lines. Based on this routing re-use technique, the losses from the connected MOM capacitors 112a-112e and along the signal paths 114 and 116 are mitigated, which results in boosting performance of the LNA 40 in advanced CMOS nodes.

Figure 8:
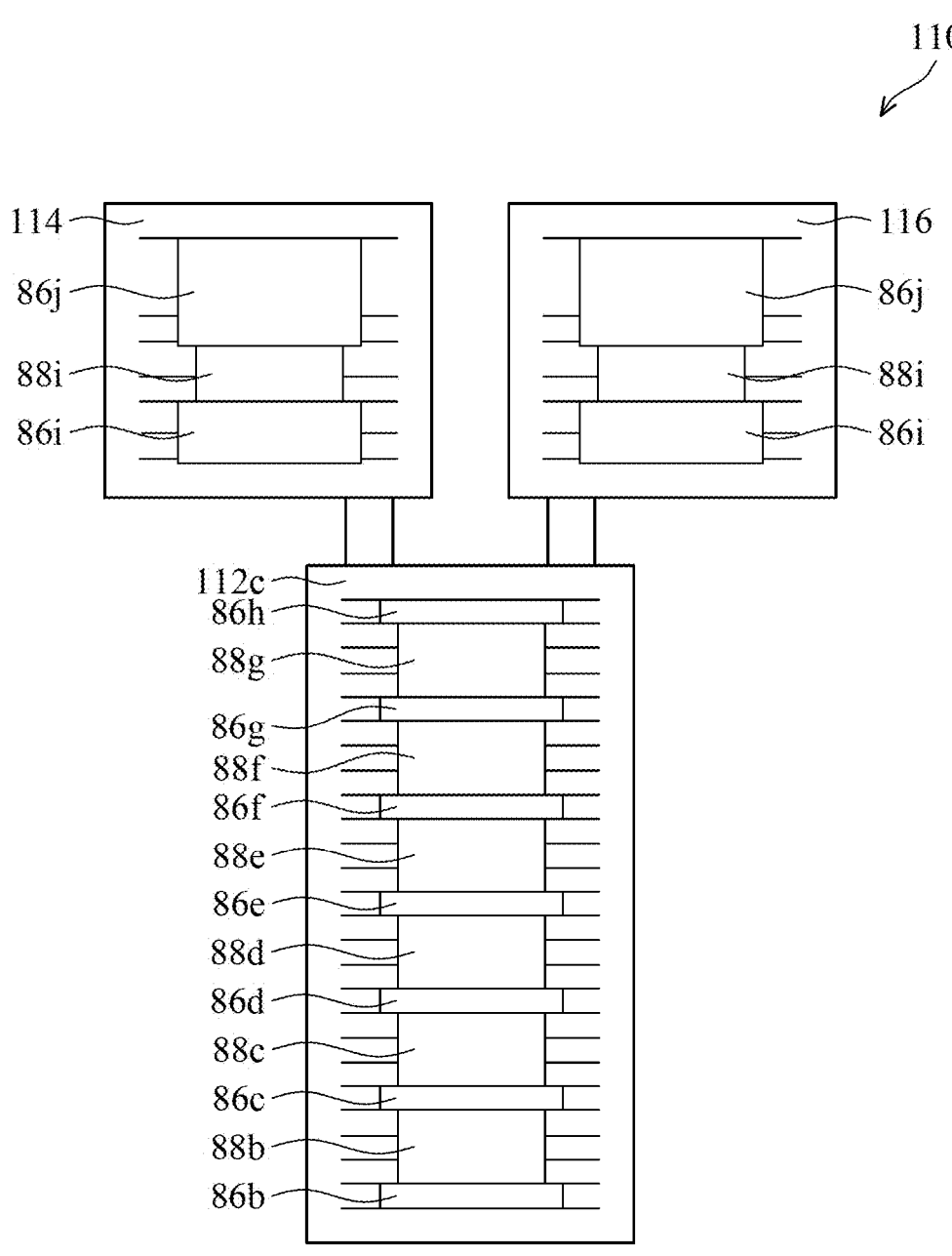
FIG. 8 is a diagram schematically illustrating a cross-section of the semiconductor device taken along the line B-B in FIG. 7, in accordance with some embodiments.

FIG. 8 is a diagram schematically illustrating a cross-section of the semiconductor device 110 taken along the line B-B in FIG. 7, in accordance with some embodiments. The multiple metal lines in the gain stage output path 114 and the multiple metal lines in the output path 116 are made from one or more of the metal layers 8 and 9 86i and 86j. The MOM capacitor 112c of the second capacitor $C_2$ 66 is made from one or more of the metal layers 1-7 86b-86h.

FIG. 9 is a diagram schematically illustrating experimental results 120 for an LNA 40 that includes each of the second capacitor $C_2$ 66 and the third capacitor $C_3$ 68 made with original large MOM capacitors, as indicated in column 122, and with smaller MOM capacitors connected in parallel that provide MOM Q enhancement, as indicated in column 124, in accordance with some embodiments.

The experimental results 120, as indicated in column 126, are for a 2.4 GHz LNA 40 in an advanced node N6, such as a 6 nm node. The experimental results 120 include $V_{DD}$ in volts (V), as indicated in row 128, direct current (dc) power $P_{dc}$ in milliwatts (mW), as indicated in row 130, gain in decibels (dB), as indicated in row 132, and a noise figure (NF) in dB, as indicated in row 134. $V_{DD}$ equals 0.75 V and power $P_{dc}$ equals 3.2 mW for the LNA 40 with original large MOM capacitors, as indicated in column 122, and with smaller MOM capacitors connected in parallel that provide MOM Q enhancement, as indicated in column 124.

The gain increases from 16.96 dB for the LNA 40 with the original large MOM capacitors, as indicated in column 122, to 18.51 dB for the LNA 40 with the smaller MOM capacitors, as indicated in column 124. Also, the NF decreases from 1.65 dB for the LNA 40 with the original large MOM capacitors, as indicated in column 122, to 1.58 dB for the LNA 40 with the smaller MOM capacitors, as indicated in column 124. Based on these results, the gain and the NF of the N6 2.4 GHz LNA 40 can be improved by 43.0% and 2.0%, respectively.

FIG. 10 is a flow chart diagram schematically illustrating a method of manufacturing an amplifier, in accordance with some embodiments. The amplifier can be an LNA with MOM Q enhancement that includes at least one MOM capacitor with enhanced Q factors, such that the gain and noise of the LNA is improved. In some embodiments, at least one larger capacitor is formed with multiple smaller MOM capacitors connected in parallel to each other to realize the capacitance value of the at least one larger capacitor. This reduces the parasitic resistance of the capacitor and increases the Q factor of the capacitor. In some embodiments, the amplifier is like LNA 20 of FIG. 1. In some embodiments, the amplifier is like LNA 40 of FIG. 2.

At step 140, the method includes forming a gain stage of the amplifier, and at step 142, the method includes forming an output impedance matching network that is connected to the gain stage and connected to an output terminal of the amplifier. In some embodiments, the gain stage is like the gain stage 48 of FIG. 2. In some embodiments, the output impedance matching network is like the output impedance matching network 50 of FIG. 2. In some embodiments, the output terminal is like the output terminal 44 of FIG. 2.

At step 144, forming the output impedance matching network includes forming a plurality of MOM capacitors connected in parallel to each other. This can provide a larger capacitance in the output impedance matching network. In some embodiments, the method includes forming an input impedance matching network that is connected to the gain stage and an input terminal of the amplifier.

In some embodiments, forming the plurality of MOM capacitors includes forming the plurality of MOM capacitors connected in parallel to each other underneath a signal path that extends from the gain stage to the output terminal. In some embodiments, the method includes forming a first capacitor having a first end connected to the gain stage and a second end connected to the output terminal, wherein forming the first capacitor includes forming first MOM capacitors connected in parallel to each other. In some embodiments, the method includes forming a second capacitor having a first end connected to the output terminal and a second end connected to a reference, wherein forming the second capacitor includes forming second MOM capacitors connected in parallel to each other. In some embodiments, forming the output impedance matching network includes providing an inductor having a first end connected to a power source terminal and a second end connected to the gain stage.

FIG. 11 is a flow chart diagram schematically illustrating another method of manufacturing an amplifier, in accordance with some embodiments. The amplifier can be an LNA with MOM Q enhancement that includes at least one MOM capacitor with enhanced Q factors, such that the gain and noise of the LNA is improved. In some embodiments, at least one larger capacitor is formed with multiple smaller MOM capacitors connected in parallel to each other to realize the capacitance value of the at least one larger capacitor. This reduces the parasitic resistance of the capacitor and increases the Q factor of the capacitor. In some embodiments, the amplifier is like LNA 20 of FIG. 1. In some embodiments, the amplifier is like LNA 40 of FIG. 2.

At step 150, the method includes forming transistors in an active area layer to form a gain stage of the amplifier. In some embodiments, the active area layer is like the active area layer 90 shown in FIG. 4.

At step 152, the method includes forming first MOM capacitors, in one or more lower metal layers that have thinner widths, to form a first capacitor in an impedance matching network. In some embodiments, the lower metal layers are like metal layers 1-7 86b-86h shown in FIG. 4.

At step 154, the method includes forming first electrical connection paths, in one or more higher metal layers that have wider widths, connected to the gain stage and to one side of the first MOM capacitors. In some embodiments, the higher metal layers are like metal layers 8 and 9 86i and 86j shown in FIG. 4. In some embodiments, forming first electrical connection paths includes forming the first electrical connection paths in the higher metal layers directly above at least part of the first MOM capacitors in the lower metal layers.

At step 156, the method includes forming second electrical connection paths, in the one or more higher metal layers that have wider widths, connected to another side of the first MOM capacitors and to an output pad, wherein the one or more lower metal layers are lower than the first electrical connection paths and the second electrical connection paths, and the one or more higher metal layers are higher than the first MOM capacitors. In some embodiments, the higher metal layers are like metal layers 8 and 9 86i and 86j shown in FIG. 4. In some embodiments, forming second electrical connection paths includes forming the second electrical connection paths in the higher metal layers directly above at least part of the first MOM capacitors in the lower metal layers.

In some embodiments, the method includes forming second MOM capacitors, in one or more lower metal layers that have thinner widths and are lower than the first electrical connection paths and the second electrical connection paths, to form a second capacitor in the impedance matching network. In some embodiments, forming second electrical connection paths includes forming the second electrical connection paths, in one or more higher metal layers that have wider widths and are higher than the first MOM capacitors, connected to one side of the second MOM capacitors, the other side of the first MOM capacitors, and the output pad.

FIG. 12 is a block diagram schematically illustrating an example of a computer system 200 configured to provide the electronic devices, semiconductor devices, and methods of the current disclosure, in accordance with some embodiments. Some or all the design, layout, and manufacture of the semiconductor devices, also referred to as semiconductor circuits, can be performed by or with the aid of the computer system 200. Also, some or all the design, layout, and manufacture of the electronic devices can be performed by or with the aid of the computer system 200. In some embodiments, the computer system 200 includes an electronic design automation (EDA) system. In some embodiments, the semiconductor devices are ICs.

In some embodiments, the system 200 is a general-purpose computing device including a processor 202 and a non-transitory, computer-readable storage medium 204. The computer-readable storage medium 204 may be encoded with, e.g., store, computer program code such as executable instructions 206. Execution of the instructions 206 by the processor 202 provides (at least in part) a design tool that implements a portion or all the functions of the system 200, such as pre-layout simulations, post-layout simulations, routing, rerouting, and final layout for manufacturing. Further, fabrication tools 208 are included to further layout and physically implement the design and manufacture of the semiconductor devices. In some embodiments, execution of the instructions 206 by the processor 202 provides (at least in part) a design tool that implements a portion or all the functions of the system 200. In some embodiments, the system 200 includes a commercial router. In some embodiments, the system 200 includes an automatic place and route (APR) system.

The processor 202 is electrically coupled to the computer-readable storage medium 204 by a bus 210 and to an I/O interface 212 by the bus 210. A network interface 214 is also electrically connected to the processor 202 by the bus 210. The network interface 214 is connected to a network 216, so that the processor 202 and the computer-readable storage medium 204 can connect to external elements using the network 216. The processor 202 is configured to execute the computer program code or instructions 206 encoded in the computer-readable storage medium 204 to cause the system 200 to perform a portion or all the functions of the system 200, such as providing the semiconductor devices and methods of the current disclosure and other functions of the system 200. In some embodiments, the processor 202 is a central processing unit (CPU), a multi-processor, a distributed processing system, an application specific integrated circuit (ASIC), and/or a suitable processing unit.

In some embodiments, the computer-readable storage medium 204 is an electronic, magnetic, optical, electromagnetic, infrared, and/or semiconductor system or apparatus or device. For example, the computer-readable storage medium 204 can include a semiconductor or solid-state memory, a magnetic tape, a removable computer diskette, a random-access memory (RAM), a read-only memory (ROM), a rigid magnetic disk, and/or an optical disk. In some embodiments using optical disks, the computer-readable storage medium 204 can include a compact disk read only memory (CD-ROM), a compact disk read/write memory (CD-R/W), and/or a digital video disc (DVD).

In some embodiments, the computer-readable storage medium 204 stores computer program code or instructions 206 configured to cause the system 200 to perform a portion or all the functions of the system 200. In some embodiments, the computer-readable storage medium 204 also stores information which facilitates performing a portion or all the functions of the system 200. In some embodiments, the computer-readable storage medium 204 stores a database 218 that includes one or more of component libraries, digital circuit cell libraries, and databases.

The system 200 includes the I/O interface 212, which is coupled to external circuitry. In some embodiments, the I/O interface 212 includes a keyboard, keypad, mouse, trackball, trackpad, touchscreen, and/or cursor direction keys for communicating information and commands to the processor 202.

The network interface 214 is coupled to the processor 202 and allows the system 200 to communicate with the network 216, to which one or more other computer systems are connected. The network interface 214 can include: wireless network interfaces such as BLUETOOTH, WIFI, WIMAX, GPRS, or WCDMA; or wired network interfaces such as ETHERNET, USB, or IEEE-1364. In some embodiments, a portion or all the functions of the system 200 can be performed in two or more systems that are like system 200.

The system 200 is configured to receive information through the I/O interface 212. The information received through the I/O interface 212 includes one or more of instructions, data, design rules, libraries of components and cells, and/or other parameters for processing by the processor 202. The information is transferred to the processor 202 by the bus 210. Also, the system 200 is configured to receive information related to a user interface (UI) through the I/O interface 212. This UI information can be stored in the computer-readable storage medium 204 as a UI 220.

In some embodiments, a portion or all the functions of the system 200 are implemented via a standalone software application for execution by a processor. In some embodiments, a portion or all the functions of the system 200 are implemented in a software application that is a part of an additional software application. In some embodiments, a portion or all the functions of the system 200 are implemented as a plug-in to a software application. In some embodiments, at least one of the functions of the system 200 is implemented as a software application that is a portion of an EDA tool. In some embodiments, a portion or all the functions of the system 200 are implemented as a software application that is used by the system 200. In some embodiments, a layout diagram is generated using a tool such as VIRTUOSO available from CADENCE DESIGN SYSTEMS, Inc., or another suitable layout generating tool.

In some embodiments, the routing, layouts, and other processes are realized as functions of a program stored in a non-transitory computer readable recording medium. Examples of a non-transitory computer readable recording medium include, but are not limited to, external/removable and/or internal/built-in storage or memory units, e.g., one or more optical disks such as a digital video disc or a digital versatile disc (DVD), a magnetic disk such as a hard disk, a semiconductor memory such as a ROM and a RAM, and a memory card, and the like.

As noted above, embodiments of the system 200 include fabrication tools 208 for implementing the manufacturing processes of the system 200. For example, based on the final layout, photolithographic masks may be generated, which are used to fabricate the semiconductor device by the fabrication tools 208.

Further aspects of device fabrication are disclosed in conjunction with FIG. 13, which is a block diagram of a semiconductor device manufacturing system 222 and a semiconductor device manufacturing flow associated therewith, in accordance with some embodiments. In some embodiments, based on a layout diagram, one or more semiconductor masks and/or at least one component in a layer of a semiconductor device is fabricated using the manufacturing system 222.

In FIG. 13, the semiconductor device manufacturing system 222 includes entities, such as a design house 224, a mask house 226, and a semiconductor device manufacturer/fabricator ("Fab") 228, that interact with one another in the design, development, and manufacturing cycles and/or services related to manufacturing a semiconductor device, such as the semiconductor devices described herein. The entities in the system 222 are connected by a communications network. In some embodiments, the communications network is a single network. In some embodiments, the communications network is a variety of different networks, such as an intranet and the internet. The communications network includes wired and/or wireless communication channels. Each entity interacts with one or more of the other entities and provides services to and/or receives services from one or more of the other entities. In some embodiments, two or more of the design house 224, the mask house 226, and the semiconductor device fab 228 are owned by a single larger company. In some embodiments, two or more of the design house 224, the mask house 226, and the semiconductor device fab 228 coexist in a common facility and use common resources.

The design house (or design team) 224 generates a semiconductor device design layout diagram 230. The semiconductor device design layout diagram 230 includes various geometrical patterns, or semiconductor device layout diagrams designed for a semiconductor device. The geometrical patterns correspond to patterns of metal, oxide, or semiconductor layers that make up the various components of the semiconductor structures to be fabricated. The various layers combine to form various semiconductor device features. For example, a portion of the semiconductor device design layout diagram 230 includes various semiconductor device features, such as diagonal vias, active areas or regions, gate electrodes, sources, drains, metal lines, local vias, and openings for bond pads, to be formed in a semiconductor substrate (such as a silicon wafer) and in various material layers disposed on the semiconductor substrate. The design house 224 implements a design procedure to form a semiconductor device design layout diagram 230. The semiconductor device design layout diagram 230 is presented in one or more data files having information of the geometrical patterns. For example, semiconductor device design layout diagram 230 can be expressed in a GDSII file format or DFII file format. In some embodiments, the design procedure includes one or more of analog circuit design, digital circuit design, logic circuit design, standard cell circuit design, power distribution network (PDN) design including power via design, supply voltage track design, reference voltage track design, place and route routines, and physical layout designs.

The mask house 226 includes data preparation 232 and mask fabrication 234. The mask house 226 uses the semiconductor device design layout diagram 230 to manufacture one or more masks 236 to be used for fabricating the various layers of the semiconductor device or semiconductor structure. The mask house 226 performs mask data preparation 232, where the semiconductor device design layout diagram 230 is translated into a representative data file (RDF). The mask data preparation 232 provides the RDF to the mask fabrication 234. The mask fabrication 234 includes a mask writer that converts the RDF to an image on a substrate, such as a mask (reticle) 236 or a semiconductor wafer 238. The design layout diagram 230 is manipulated by the mask data preparation 232 to comply with characteristics of the mask writer and/or criteria of the semiconductor device fab 228. In FIG. 13, the mask data preparation 232 and the mask fabrication 234 are illustrated as separate elements. In some embodiments, the mask data preparation 232 and the mask fabrication 234 can be collectively referred to as mask data preparation.

In some embodiments, the mask data preparation 232 includes an optical proximity correction (OPC) which uses lithography enhancement techniques to compensate for image errors, such as those that can arise from diffraction, interference, other process effects and the like. The OPC adjusts the semiconductor device design layout diagram 230. In some embodiments, the mask data preparation 232 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, the mask data preparation 232 includes a mask rule checker (MRC) that checks the semiconductor device design layout diagram 230 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the semiconductor device design layout diagram 230 to compensate for limitations during the mask fabrication 234, which may undo part of the modifications performed by OPC to meet mask creation rules.

In some embodiments, the mask data preparation 232 includes lithography process checking (LPC) that simulates processing that will be implemented by the semiconductor device fab 228. LPC simulates this processing based on the semiconductor device design layout diagram 230 to create a simulated manufactured device. The processing parameters in LPC simulation can include parameters associated with various processes of the semiconductor device manufacturing cycle, parameters associated with tools used for manufacturing the semiconductor device, and/or other aspects of the manufacturing process. LPC considers various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are to be repeated to further refine the semiconductor device design layout diagram 230.

The above description of mask data preparation 232 has been simplified for the purposes of clarity. In some embodiments, data preparation 232 includes additional features such as a logic operation (LOP) to modify the semiconductor device design layout diagram 230 according to manufacturing rules. Additionally, the processes applied to the semiconductor device design layout diagram 230 during data preparation 232 may be executed in a variety of different orders.

After the mask data preparation 232 and during the mask fabrication 234, a mask 236 or a group of masks 236 are fabricated based on the modified semiconductor device design layout diagram 230. In some embodiments, the mask fabrication 234 includes performing one or more lithographic exposures based on the semiconductor device design layout diagram 230. In some embodiments, an electron-beam (e-beam) or a mechanism of multiple e-beams is used to form a pattern on a mask (photomask or reticle) 236 based on the modified semiconductor device design layout diagram 230. The mask 236 can be formed in various technologies. In some embodiments, the mask 236 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region, and transmits through the transparent regions. In one example, a binary mask version of the mask 236 includes a transparent substrate (e.g., fused quartz) and an opaque material (e.g., chromium) coated in the opaque regions of the binary mask. In another example, the mask 236 is formed using a phase shift technology. In a phase shift mask (PSM) version of the mask 236, various features in the pattern formed on the phase shift mask are configured to have proper phase difference to enhance the resolution and imaging quality. In various examples, the phase shift mask can be attenuated PSM or alternating PSM. The mask(s) generated by the mask fabrication 234 is used in a variety of processes. For example, such a mask(s) is used in an ion implantation process to form various doped regions in the semiconductor wafer 238, in an etching process to form various etching regions in the semiconductor wafer 238, and/or in other suitable processes.

The semiconductor device fab 228 includes wafer fabrication 240. The semiconductor device fab 228 is a semiconductor device fabrication business that includes one or more manufacturing facilities for the fabrication of a variety of different semiconductor device products. In some embodiments, the semiconductor device fab 228 is a semiconductor foundry. For example, there may be a manufacturing facility for the front end of line (FEOL) fabrication of a plurality of semiconductor device products, while a second manufacturing facility may provide the BEOL fabrication for the interconnection and packaging of the semiconductor device products, and a third manufacturing facility may provide other services for the foundry business.

The semiconductor device fab 228 uses the mask(s) 236 fabricated by the mask house 226 to fabricate the semiconductor structures or semiconductor devices 242 of the current disclosure. Thus, the semiconductor device fab 228 at least indirectly uses the semiconductor device design layout diagram 230 to fabricate the semiconductor structures or semiconductor devices 242 of the current disclosure. Also, the semiconductor wafer 238 includes a silicon substrate or other proper substrate having material layers formed thereon, and the semiconductor wafer 238 further includes one or more of various doped regions, dielectric features, multilevel interconnects, and the like (formed at subsequent manufacturing steps). In some embodiments, the semiconductor wafer 238 is fabricated by the semiconductor device fab 228 using the mask(s) 236 to form the semiconductor structures or semiconductor devices 242 of the current disclosure. In some embodiments, the semiconductor device fabrication includes performing one or more lithographic exposures based at least indirectly on the semiconductor device design layout diagram 230.

Disclosed embodiments thus include LNAs that include one or more MOM capacitors with enhanced Q factors, such that the gain and noise of the LNAs are improved. In some embodiments, a capacitor is formed with multiple smaller MOM capacitors connected in parallel to each other to realize the capacitance value of the capacitor. The smaller MOM capacitors, reduce the parasitic resistance of the capacitors and increase the Q factor of the capacitors.

Disclosed embodiments further include a routing re-use technique, where the multiple smaller MOM capacitors connected in parallel to each other are situated underneath a signal path, such as a signal path from the gain stage to the output terminal of the LNA. This mitigates power loss in the signal path and results in boosting the performance of the LNA in terms of gain and noise factors.

Advantages of the MOM Q enhancement techniques, include increased gain and reduced noise at advanced nodes, which results in improved LNA performance and justifies the increased cost of the advanced node.

In accordance with some embodiments, an electronic device includes an amplifier having an input terminal and an output terminal. The amplifier includes a gain stage and an output impedance matching network connected to the gain stage and to the output terminal. The output impedance matching network includes a plurality of MOM capacitors connected in parallel to each other.

In accordance with further embodiments, an amplifier device includes an input terminal and an output terminal, an input impedance matching network connected to the input terminal, a gain stage connected to the input impedance matching network, and an output impedance matching network connected to the gain stage and the output terminal. The output impedance matching network includes a first capacitor having a first end connected to the gain stage and a second end connected to the output terminal, and the first capacitor includes first multiple MOM capacitors connected in parallel to each other.

In accordance with still further disclosed aspects, a method of manufacturing an amplifier. The method includes forming transistors in an active area layer to form a gain stage of the amplifier; forming first MOM capacitors, in one or more lower metal layers that have thinner widths, to form a first capacitor in an impedance matching network; forming first electrical connection paths, in one or more higher metal layers that have wider widths, connected to the gain stage and to one side of the first MOM capacitors; and forming second electrical connection paths, in one or more higher metal layers that have wider widths, connected to another side of the first MOM capacitors and to an output pad.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An electronic device, comprising:
an amplifier having an input terminal and an output terminal and including:
a gain stage; and
an output impedance matching network connected to the gain stage and to the output terminal,
wherein the output impedance matching network includes:
first metal-oxide-metal (MOM) capacitors, in one or more lower metal layers that have thinner widths, connected in parallel to each other to form a first capacitor in the output impedance matching network;
first electrical connection paths, in one or more higher metal layers that have wider widths, connected to the gain stage and to one side of the first MOM capacitors; and
second electrical connection paths, in the one or more higher metal layers that have wider widths, connected to another side of the first MOM capacitors and to the output terminal.

2. The device of claim 1, wherein the first electrical connection paths include multiple metal lines, and at least part of the first electrical connection paths are situated over at least part of each of the first MOM capacitors, and at least part of the second electrical connection paths are situated over at least part of each of the first MOM capacitors.

3. The device of claim 1, wherein the output impedance matching network includes an inductor having a first end connected to a power source terminal and a second end connected to the gain stage and the first capacitor.

4. The device of claim 1, wherein the output impedance matching network includes a second capacitor having a first end connected to the output terminal and a second end connected to a reference, the second capacitor including multiple MOM capacitors connected in parallel to each other.

5. The device of claim 1, wherein the gain stage includes at least two metal-oxide semiconductor field-effect transistors having drain/source paths connected in series.

6. The device of claim 1, comprising an input impedance matching network having a first end connected to the input terminal and a second end connected to the gain stage.

7. The device of claim 1, comprising a source degeneration circuit having a first end connected to the gain stage and a second end connected to a reference.

8. The device of claim 1, wherein the output impedance matching network includes second MOM capacitors, in one or more lower metal layers that have thinner widths, connected in parallel to each other to form a second capacitor in the output impedance matching network.

9. The device of claim 8, wherein the output impedance matching network includes third electrical connection paths, in one or more higher metal layers that have wider widths, connected to the output terminal and to one side of the second MOM capacitors.

10. The device of claim 9, wherein the output impedance matching network includes fourth electrical connection paths connected to another side of the second MOM capacitors and to a reference.

11. An amplifier device, comprising:
an input terminal and an output terminal;
an input impedance matching network connected to the input terminal;
a gain stage connected to the input impedance matching network; and
an output impedance matching network connected to the gain stage and the output terminal,
wherein the output impedance matching network includes;
first multiple metal-oxide-metal (MOM) capacitors in one or more lower metal layers that have thinner widths, connected in parallel to each other to form a first capacitor having a first end connected to the gain stage and a second end connected to the output terminal,
first electrical connection paths, in one or more high metal layers that have wider widths, connected to the gain stage and to one side of the first multiple MOM capacitors; and
second electrical connection paths, in the one or more higher metal layers that have wider widths, connected to another side of the first multiple MOM capacitors and to the output terminal.

12. The device of claim 11, wherein the output impedance matching network includes a second capacitor having a first end connected to the output terminal and a second end connected to a reference, the second capacitor including second multiple MOM capacitors connected in parallel to each other.

13. The device of claim 11, wherein the output impedance matching network includes an inductor having a first end connected to a power source terminal and a second end connected to the gain stage and the first capacitor.

14. The device of claim 11, wherein the input impedance matching network includes an inductor having a first end connected to the input terminal and a second end connected to the gain stage.

15. The device of claim 11, wherein the first electrical connection paths include multiple metal lines, and at least part of the first electrical connection paths are situated over at least part of each of the first multiple MOM capacitors, and at least part of the second electrical connection paths are situated over at least part of each of the first multiple MOM capacitors.

16. A method of manufacturing an amplifier, the method comprising:

forming transistors in an active area layer to form a gain stage of the amplifier;

forming first metal-oxide-metal (MOM) capacitors, in one or more lower metal layers that have thinner widths, to form a first capacitor in an impedance matching network;

forming first electrical connection paths, in one or more higher metal layers that have wider widths, connected to the gain stage and to one side of the first MOM capacitors; and forming second electrical connection paths, in the one or more higher metal layers that have wider widths, connected to another side of the first MOM capacitors and to an output pad, wherein the one or more lower metal layers are lower than the first electrical connection paths and the second electrical connection paths, and the one or more higher metal layers are higher than the first MOM capacitors.

17. The method of claim 16, wherein forming first electrical connection paths includes forming the first electrical connection paths in the higher metal layers directly above at least part of the first MOM capacitors in the lower metal layers.

18. The method of claim 17, wherein forming second electrical connection paths includes forming the second electrical connection paths in the higher metal layers directly above at least part of the first MOM capacitors in the lower metal layers.

19. The method of claim 16, comprising forming second MOM capacitors, in one or more lower metal layers that have thinner widths and are lower than the first electrical connection paths and the second electrical connection paths, to form a second capacitor in the impedance matching network.

20. The method of claim 19, wherein forming second electrical connection paths includes forming the second electrical connection paths, in one or more higher metal layers that have wider widths and are higher than the first MOM capacitors, connected to one side of the second MOM capacitors, the other side of the first MOM capacitors and the output pad.

* * * * *